(12) United States Patent
Chang et al.

(10) Patent No.: US 6,500,263 B2
(45) Date of Patent: Dec. 31, 2002

(54) SEMICONDUCTOR SUBSTRATE PROCESSING CHAMBER HAVING INTERCHANGEABLE LIDS ACTUATING PLURAL GAS INTERLOCK LEVELS

(75) Inventors: Yu Chang, San Jose, CA (US); Wen Xiao Chen, Roseville, CA (US); Gwo-Chuan Tzu, Sunnyvale, CA (US)

(73) Assignee: Applied Materials, Inc,, Santa Clara, CA (US)

( * ) Notice: Subject to any disclaimer, the term of this patent is extended or adjusted under 35 U.S.C. 154(b) by 42 days.

(21) Appl. No.: 09/817,786

(22) Filed: Mar. 26, 2001

(65) Prior Publication Data

US 2002/0134505 A1 Sep. 26, 2002

(51) Int. Cl.$^7$ ............................................. C23C 16/000
(52) U.S. Cl. ........................ 118/715; 118/707; 118/733; 427/255.28
(58) Field of Search ................................ 118/715, 707, 118/733

(56) References Cited

U.S. PATENT DOCUMENTS 5,551,165 A * 9/1996 Turner et al. .................. 34/404
6,086,676 A    7/2000 Kao et al.

FOREIGN PATENT DOCUMENTS

WO         WO 99/03134         1/1999

* cited by examiner

Primary Examiner—Marian C. Knode
Assistant Examiner—Karla Moore
(74) Attorney, Agent, or Firm—Dugan & Dugan, LLP

(57) ABSTRACT

Multiple levels of interlocks are provided relative to gas flow for a chemical vapor deposition chamber. When a chamber lid used for normal processing is in place, no interlock is in effect. When a lid used during maintenance operations is in place, flow of toxic gas to the chamber is interlocked, but flow of purge gas is permitted. When no lid is in place, all gas flow to the chamber is interlocked. The interlock arrangement may be implemented with two switches, both of which are actuated when the lid for normal processing is in place, and only one of which is actuated by the lid for the maintenance process.

29 Claims, 4 Drawing Sheets

SEMICONDUCTOR SUBSTRATE PROCESSING CHAMBER HAVING INTERCHANGEABLE LIDS ACTUATING PLURAL GAS INTERLOCK LEVELS

FIELD OF THE INVENTION

This invention generally relates to interlock systems for semiconductor fabrication systems, and is more particularly concerned with interlock systems which prevent transmission of gases to a processing chamber.

BACKGROUND OF THE INVENTION

Fabrication of semiconductors typically involves performing a number of processes with respect to a substrate, such as a wafer. One commonly employed process is chemical vapor deposition (CVD). In CVD processing a wafer is placed in a processing chamber referred to as a deposition chamber. A process gas is flowed to the deposition chamber and interacts with the wafer to deposit a thin film on the wafer. The thin film deposited on the wafer may be, for example, a metal. During deposition processing it may also be desirable to flow a purge gas to a rear side of a pedestal on which the wafer is supported, to prevent thin film deposition on the rear side of the pedestal.

In a conventional deposition chamber, the chamber may include a lid that is removable to permit access to the interior of the chamber for maintenance or other purposes. It is also known to provide an additional lid that may be substituted for the regular lid. The additional lid may have transparent panels or viewports formed therein to allow viewing of the interior of the chamber during maintenance operations such as calibration of a wafer-handling robot that inserts wafers into the chamber and removes wafers from the chamber.

Many process gases used for CVD are toxic. Accordingly, it is known as a safety measure to provide an interlock arrangement that prevents gases from flowing to the deposition chamber when no lid is present on the chamber. As is familiar to those who are skilled in the art, the interlock arrangement overrides any instructions from the system controller by closing a valve or valves so that gas flow to the deposition chamber is cut off.

The present inventors have recognized that it would be desirable to provide additional safety measures at times when maintenance functions are being performed with respect to deposition chambers.

SUMMARY OF THE INVENTION

One aspect of the invention provides a method of operating a processing chamber, where the processing chamber has associated with it a mechanism for selectively transmitting a plurality of gases to the processing chamber, and the plurality of gases includes at least one toxic gas. The method according to this aspect of the invention includes actuating a first interlock condition to prevent transmission of all of the plurality of gases to the process chamber when no lid is situated in a closed position on the processing chamber. The method further includes actuating a second interlock condition to prevent transmission of the at least one toxic gas to the processing chamber when a first lid (a lid installed for a maintenance operation) is situated in a closed position on the processing chamber. Also included in the method is the step of allowing all of the plurality of gases to be transmitted to the processing chamber when a second lid (installed for normal processing such as CVD processing) is situated in a closed position on the processing chamber.

The multiple levels of interlocks provided in accordance with the invention, with all gas flow being prevented or "interlocked" when no lid is present, and toxic gas flow being interlocked when the lid for maintenance is present, provides for enhanced safety during maintenance operations.

The multiple levels of interlocks may be implemented by providing two separate switches on the processing chamber. The lid employed for normal processing operations (the "processing lid") may be equipped with a pair of tabs adapted to respectively actuate the two switches. The lid used for maintenance operations may be equipped with only one tab, which actuates only one of the switches when the maintenance lid is in place on the processing chamber. Accordingly, when neither switch is actuated, the first interlock condition is actuated, so that all gases are prevented from flowing to the processing chamber. When one of the switches is actuated but the other is not (e.g., due to presence of the maintenance lid), then the second interlock condition is actuated, such that transmission of toxic gases to the processing chamber is prevented but transmission of non-toxic gases is still enabled. When both switches are actuated (e.g., by the processing lid), no interlock is in effect, so that all gases are allowed to flow to the processing chamber.

Other objects, features and advantages of the invention will become more fully apparent from the following detailed description of the exemplary embodiments, the appended claims and the accompanying drawings.

DESCRIPTION OF A PREFERRED EMBODIMENT

Relevant Terminology

As used herein, a "toxic gas" refers to a gas that is harmful to humans and/or the environment including, but not limited to, gases that are poisonous, caustic, pyrophoric, explosive, etc., as well as gases that may damage the ozone layer of the atmosphere such as greenhouse gases. A lid is in a "closed position" when it is positioned on a chamber so as to seal or substantially close an opening in the chamber. An "interlock condition" is a condition that prevents the flow of at least one gas to a chamber. A gas may include a vaporized liquid.

Figure 1:
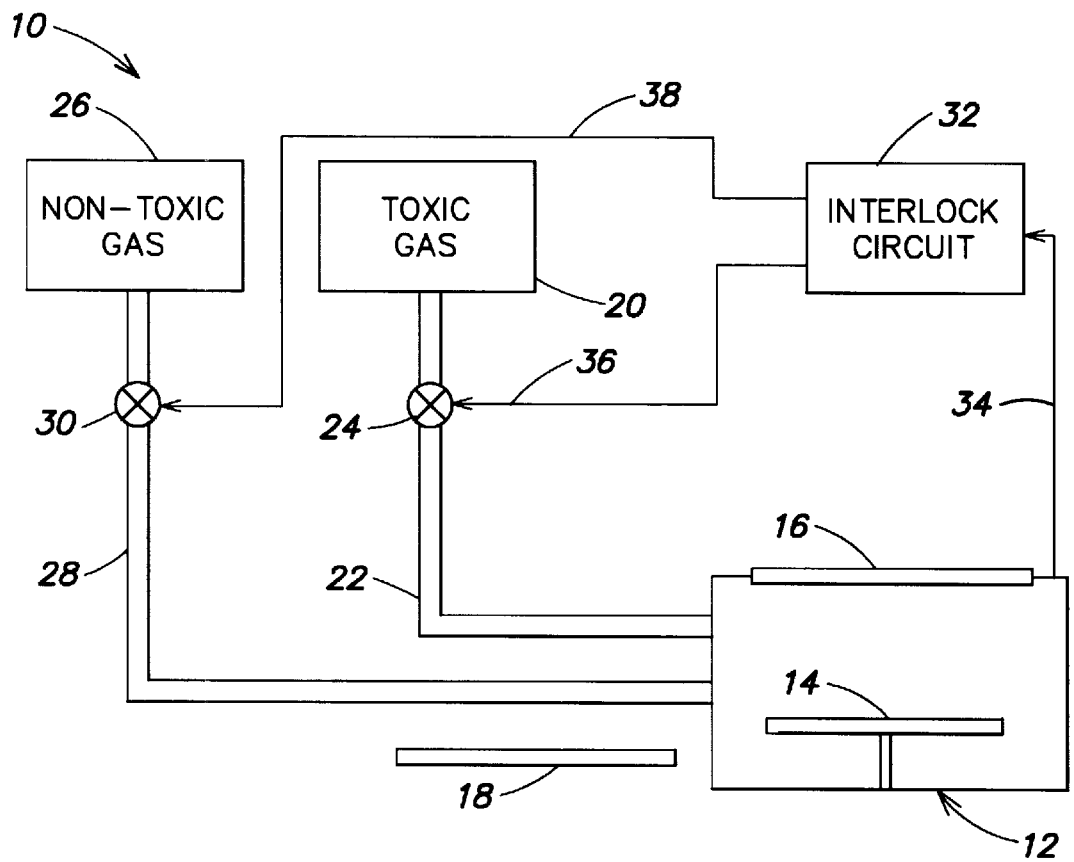
FIG. 1 is a schematic block diagram of a semiconductor fabrication system provided in accordance with the invention.

FIG. 1 is a schematic block diagram which illustrates a semiconductor fabrication system 10 provided in accordance with the present invention. Included in the semiconductor fabrication system 10 is a processing chamber 12. The chamber 12 may be a chemical vapor deposition (CVD) chamber of the type used for tungsten deposition in the 300 mm Centura system available from Applied Materials, Inc., the assignee of this application. Although only one processing chamber is shown in FIG. 1, it should be understood that the semiconductor fabrication system 10 may include other chambers, in which other processes such as etching, heat treatment, photolithography, physical vapor deposition (PVD) and so forth may be performed. The semiconductor fabrication system 10 may also include associated chambers such as one or more transfer chambers, one or more loadlocks, and so forth. There may also be included in the semiconductor fabrication system 10 one or more wafer-handling robots as well as robots adapted to transport cassettes in which a plurality of wafers are stored and transported.

Continuing to refer to FIG. 1, a pedestal 14 is provided in the processing chamber 12. The pedestal 14 is adapted to hold a wafer (not shown) during deposition processing. A heater, which is not separately shown, may be associated with the pedestal 14 to heat the wafer to a suitable temperature for the deposition process.

A lid 16 (hereinafter "processing lid 16") is installed on the processing chamber 12. In accordance with conventional practice, the processing lid 16 may be sealed so that the chamber 12 may be pumped out by an exhaust pump (not shown) to a low pressure that is suitable for a CVD process.

Another lid 18 (hereinafter "maintenance lid 18") is available for installation on the processing chamber 12 in place of the processing lid 16. When not in use, the maintenance lid 18 may be stored at any convenient location.

A source 20 of toxic gas is associated with the processing chamber 12. A first gas supply line 22 provides a gas transmission path from the toxic gas source 20 to the processing chamber 12. A valve 24 installed on gas supply line 22 controls flow of the toxic gas from the gas source 20 to the processing chamber 12. The toxic gas source 20 may comprise a plurality of gas sources, and the gases supplied therefrom may include CVD process gases such as tungsten fluoride ($WF_6$), silane ($SiH_4$), diborane ($B_2H_6$) or hydrogen gas ($H_2$). A toxic gas supplied from the gas source 20 may also be a chamber cleaning gas such as $NF_3$.

A source 26 of a non-toxic gas is also associated with the processing chamber 12. A second gas supply line 28 provides a path for transmission of the non-toxic gas from gas source 26 to processing chamber 12. A valve 30 is installed on the gas supply line 28 to control the flow of gas from non-toxic gas source 26 to processing chamber 12. The non-toxic gas provided from the gas source 26 may be a purge gas such as nitrogen or argon, or another inert gas. In accordance with conventional practice, the purge gas may be flowed toward the rear side of the pedestal 14 to prevent deposition from occurring on the rear side of pedestal 14.

An interlock circuit 32 is also included in the semiconductor fabrication system 10. Any conventional interlock circuit may be employed for the interlock circuit 32. The interlock circuit 32 is coupled via a signal path 34 to switches (not shown in FIG. 1) that are mounted on the processing chamber 12. According to an arrangement that will be described below, the switches indicate whether processing lid 16 or maintenance lid 18 is installed on the processing chamber 12, or whether no lid is installed on the processing chamber 12. The interlock circuit 32 is also arranged to respond to indications of interlock conditions by forcing closure of valves 24 and 30, as respectively indicated at 36 and 38 in FIG. 1.

In accordance with known practices, the interlock circuit 32 may also be employed to provide interlocking of the valves 24, 30 for reasons other than the absence of the chamber lid. For example, gas flow may be interlocked upon failure of the chamber exhaust pump (not shown). Moreover, the interlock circuit 32 may interdict operation of devices other than gas supply line valves 24 and 30. For example, the interlock circuit 32 may automatically turn off the heater (not separately shown) when a temperature sensor (not shown) in the processing chamber 12 indicates overheating in the processing chamber 12.

The semiconductor fabrication system 10 may also include a controller (not shown) that, in the absence of an interlock condition, controls the valves 24, 30. The controller may also control other chamber components such as the pedestal heater, the exhaust pump (not shown), a pedestal lift mechanism (not shown), a slit valve (not shown), and so on.

Figure 2:
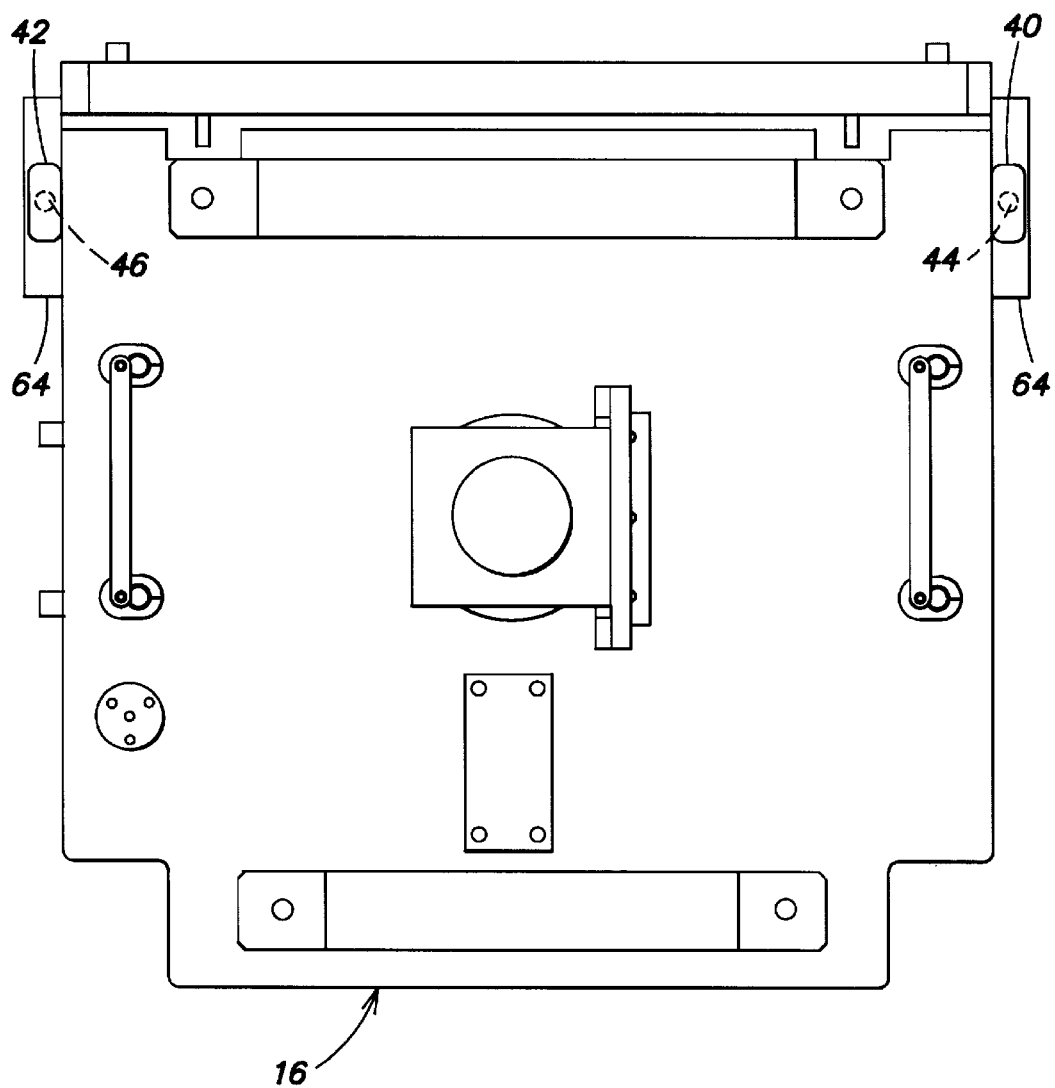
FIG. 2 is a plan view of a lid provided in accordance with the invention for installation on a deposition chamber during normal processing operations.

FIG. 2 is a plan view showing features of the processing lid 16. It is assumed that processing lid 16 is installed on the processing chamber 12 during normal processing operations such as CVD processing. The processing lid 16 is equipped with tabs 40, 42. Tab 40 is adapted to actuate a first switch 44 that is mounted on the processing chamber 12. Tab 42 is adapted to actuate a second switch 46 which may be mounted on the processing chamber 12 at the opposite side, with respect to switch 44, of an opening (not shown) that is adapted to be closed by the processing lid 16. The switches 44, 46 are preferably push-button type switches, and are preferably identical, to avoid confusion during assembly of the processing chamber 12.

Figure 3:
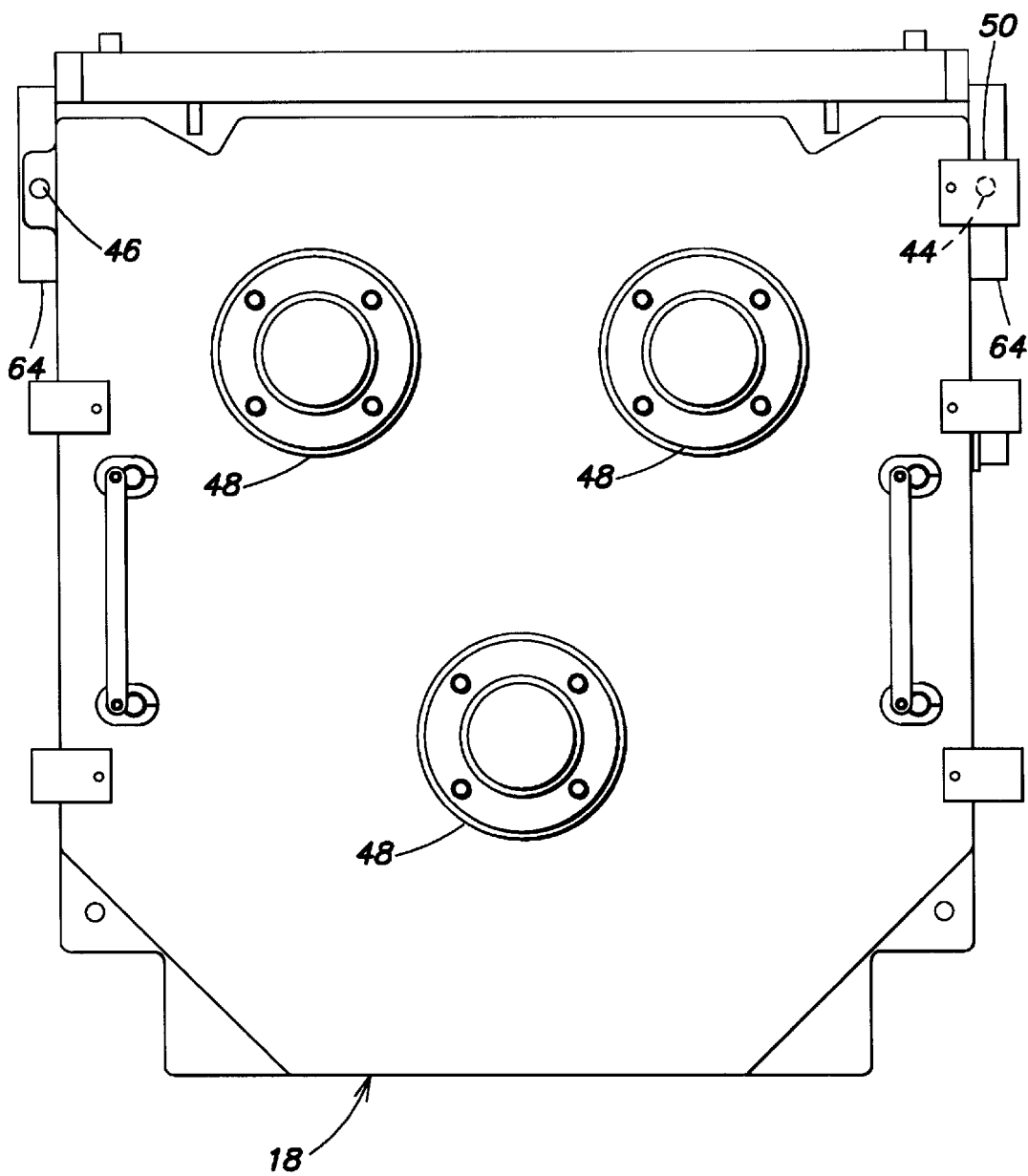
FIG. 3 is a plan view of a lid provided in accordance with the invention for installation on the deposition chamber during maintenance operations.

FIG. 3 is a plan view showing features of the maintenance lid 18, which is installed on the processing chamber 12 during maintenance operations in place of processing lid 16. Maintenance lid 18 is arranged so that it can only be installed on the processing chamber 12 in one orientation. Maintenance lid 18 has viewports 48 which are provided to permit viewing of the interior of the processing chamber 12 during maintenance. Such viewing of the interior may be helpful to observe processes such as movements of a wafer-handling robot (not shown) during calibration of the robot. Maintenance lid 18 also is equipped with a tab 50 provided at the locus of the first switch 44 and adapted to actuate the switch 44. It will be observed that, unlike processing lid 16, maintenance lid 18 has no tab at the locus of switch 46 and is not adapted to actuate switch 46. Except for the arrangement of tabs 40, 42 and 50 as illustrated in FIGS. 2 and 3, the lids 16, 18 may be constructed like conventional processing chamber lids used for normal processing and maintenance processes, respectively.

Figure 4:
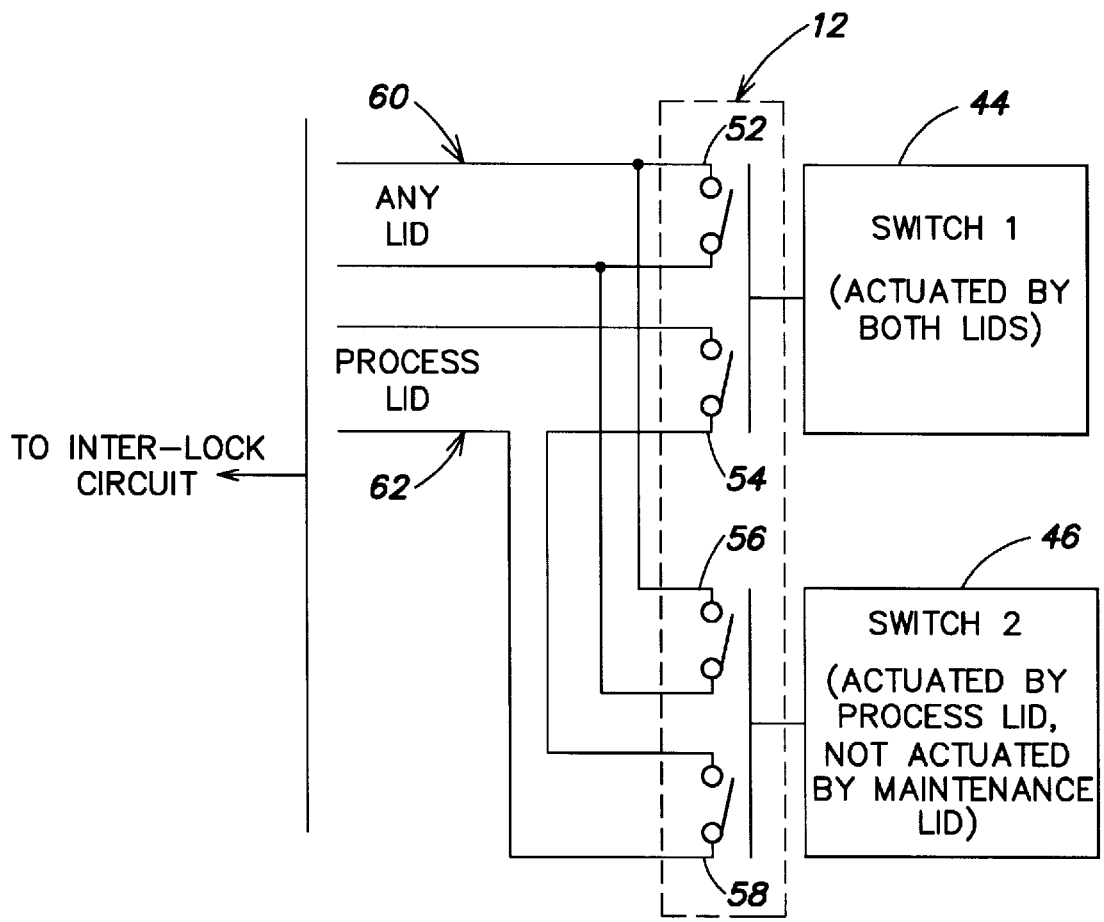
FIG. 4 is a schematic illustration of interlock signal circuitry provided in accordance with the invention.

FIG. 4 is a schematic representation of an interlock signal circuit arrangement which includes switches 44 and 46. As described below, the switches 44 and 46 communicate with the interlock circuit 32 such that the interlock circuit 32 allows (1) neither the gas from the toxic gas source 20 nor from the non-toxic gas source 26 to flow to the chamber 26 when no lid is present on the chamber 12. (e.g., when both switches 44 and 46 are open); (2) only gas from the non-toxic gas source 26 to flow to the chamber 12 when the maintenance lid 18 is present on the chamber 12 (e.g., when switch 44 is closed); and (3) gas from the both the toxic gas source 20 and the non-toxic gas source 26 to flow to the chamber 12 when the processing lid 16 is present on the chamber 12 (e.g., when both switches 44 and 46 are closed).

With reference to FIG. 4, switches 44 and 46 are preferably dual contact switches. That is, switch 44 includes contacts 52, 54 and switch 46 includes contacts 56 and 58. A first interlock signal circuit 60 is formed of a parallel arrangement of contacts 52 and 56. That is, the first interlock signal circuit 60 forms a closed or completed circuit (is "closed") when either one of the switches 44 and 46 is actuated, and is in an open-circuit condition otherwise. A second interlock signal circuit 62 is formed as a serial arrangement of contacts 54, 58 so that the interlock signal circuit 62 is closed when both switches 44 and 46 are actuated, and is in an open-circuit condition otherwise. In other words, the interlock signal circuit 60 is closed when either one of the lids 16, 18 is installed on the processing chamber 12, and is in an open-circuit condition when no lid is installed on the processing chamber 12. The interlock signal circuit 62 is closed when the processing lid 16 is installed on the processing chamber 12 and is in an open-circuit condition when either maintenance lid 18 is installed on the processing chamber 12 or no lid is installed on the processing chamber 12. From the arrangement of FIG. 4 it will be appreciated that switches 44 and 46 are interchangeable. That is, it does not matter which one of switches 44, 46 maintenance lid 18 is arranged to actuate.

In operation of the interlock arrangement of the present invention, there are three cases to consider.

Case 1: During a normal CVD processing operation, processing lid 16 is installed on the processing chamber 12. Tabs 40 and 42 respectively actuate switches 44 and 46 (FIG. 2). Contacts 52, 54, 56 and 58 are all closed, and, consequently, interlock signal circuits 60 and 62 are both closed. The interlock circuit 32 detects that both circuits 60 and 62 are closed, no interlock is actuated by the interlock circuit 32 (FIG. 1), and valves 24 and 30 are responsive to control signals from a system controller (not shown) to carry out the recipe for the CVD process.

Case 2: During a maintenance operation, maintenance lid 18 is installed on the processing chamber 12 in place of processing lid 16. Tab 50 of maintenance lid 18 actuates switch 44 (FIG. 3); switch 46 is not actuated. Consequently, contacts 52 and 54 (FIG. 4) are closed and contacts 56 and 58 are open. Interlock signal circuit 60 is in a closed condition because of the closure of contact 52. Interlock signal circuit 62 is in an open-circuit condition because contact 58 is open. The interlock circuit 32 responds to the open-circuit condition of interlock signal circuit 62 by actuating an interlock condition according to which valve 24 is closed. Because of the closure of valve 24, toxic gas from the gas source 20 is prevented from flowing to the processing chamber 12. Meanwhile, because interlock circuit 60 is closed, interlock circuit 32 does not interlock valve 30 so that purge gas, which may be required for maintenance operations, is free to flow from gas source 26 via gas supply line 28 to the processing chamber 12, under the control of the system controller.

Case 3: No lid is installed on the processing chamber 12. Neither switch 44 nor switch 46 is actuated, and all four contacts 52, 54, 56 and 58 are open. Both interlock signal circuits 60 and 62 are in an open-circuit condition. The interlock circuit 32 responds to the open-circuit condition of interlock signal circuit 60 by actuating an interlock condition such that valves 24 and 30 are closed. Neither process gas from gas supply 20 nor purge gas from gas supply 26 can flow to the processing chamber 12.

With the arrangement of the present invention, safety is improved during maintenance operations since, even with the maintenance lid 18 in place, flow of toxic gas to the processing chamber 12 is interlocked. Meanwhile, flow of purge gas which may be useful for maintenance operations is not interlocked.

Furthermore, the interlocking arrangement is keyed to the configuration of the lids 16 and 18, and may utilize two identical switches installed on the processing chamber 12, so that the arrangement is easy and economical to manufacture. Both switches are adapted so as to be actuated by the corresponding tabs 44, 46, 50 of the lids 16, 18. To deter erroneous actuation each switch may be located within a recessed area (represented by reference numeral 64 on FIG. 3) that corresponds to the respective tabs 44, 46, 50.

The foregoing description discloses only an exemplary embodiment of the invention; modifications of the above-disclosed apparatus and method which fall within the scope of the invention will be readily apparent to those of ordinary skill in the art. For example, the interlock signals may be generated by logic circuitry in place of the dual-contact switches and the parallel and serial circuit arrangements described above. That is, a suitable arrangement of AND gates, OR gates and/or inverters may be employed to translate the state of single contact switches into two levels of interlock signal and a non-interlock condition according to conventional logic circuitry techniques.

It is also contemplated that one switch may be actuated only by processing lid 16 and that the other switch may be actuated only by maintenance lid 18. Again, suitable logic circuitry may be employed to develop the multiple levels of interlocking called for by the present invention.

The present invention similarly may be employed to selectively control the delivery of any fluid to a chamber, whether the fluid is a liquid or a gas. For example, the present invention may be employed to selectively prevent the flow of a toxic processing liquid such as $TiCl_4$ to a vaporizing device when no lid or when the maintenance lid 18 is present on the chamber 12 so that vaporized processing liquid is selectively prevented from entering the chamber 12. The delivery of processing liquid thereby is selectively controlled.

Accordingly, while the present invention has been disclosed in connection with preferred embodiments thereof, it should be understood that other embodiments may fall within the spirit and scope of the invention, as defined by the following claims.

The invention claimed is:

1. A method of operating a processing chamber, the processing chamber having associated therewith a mechanism for selectively transmitting a plurality of gases to the processing chamber, the plurality of gases including at least one toxic gas, the method comprising the steps of:
   actuating a first interlock condition to prevent transmission of all of the plurality of gases to the processing chamber when no lid is situated in a closed position on the processing chamber;
   actuating a second interlock condition to prevent transmission of the at least one toxic gas to the processing chamber, while allowing transmission of at least another of the plurality of gases to the processing chamber, when a first lid is situated in a closed position on the processing chamber; and
   allowing all of the plurality of gases to be transmitted to the processing chamber when a second lid is situated in a closed position on the process chamber.

2. The method of claim 1, wherein,
   the step of actuating the first interlock condition includes allowing a first switch on the processing chamber and a second switch on the processing chamber to be in an unactuated condition;
   the step of actuating the second interlock condition includes actuating the first switch and allowing the second switch to be in an unactuated condition; and
   the step of allowing all of the plurality of gases to be transmitted to the processing chamber includes actuating the first switch and the second switch.

3. The method of claim 1, further comprising performing a substrate processing function when the second lid is situated in a closed-position on the processing chamber.

4. The method of claim 3, wherein the substrate processing function is a deposition process.

5. The method of claim 4, wherein the deposition process is a chemical vapor deposition process.

6. The method of claim 1, further comprising performing a maintenance function when the first lid is situated in a closed position on the processing chamber.

7. The method of claim 6, wherein the maintenance function is a robot calibration function.

8. A semiconductor fabrication system, comprising:
   a processing chamber adapted to selectively receive either one of a first lid and a second lid;
   a gas transmission mechanism adapted to selectively transmit a plurality of gases to the processing chamber, the plurality of gases including at least one toxic gas; and
   an interlock circuit operatively coupled to the gas transmission mechanism and adapted to:
      actuate a first interlock condition to prevent transmission of all of the plurality of gases to the processing chamber when no lid is situated in a closed position on the processing chamber;
      actuate a second interlock condition to prevent transmission of the at least one toxic gas to the processing chamber while allowing transmission of at least another of the plurality of gases to the processing chamber, when the first lid is situated in the closed position on the processing chamber; and
      allow all of the plurality of gases to be transmitted to the processing chamber when the second lid is situated in a closed position on the processing chamber.

9. The semiconductor fabrication system of claim 8, further comprising:
   a first switch positioned on the processing chamber so as to be actuated by either one of the first lid and the second lid when the first or second lid is situated in a closed position; and
   a second switch positioned on the processing chamber so as to be actuated only by the second lid when the second lid is situated in a closed position.

10. The semiconductor fabrication system of claim 9, wherein the first switch has a first contact and a second contact and the second switch has a third contact and a fourth contact.

11. The semiconductor fabrication system of claim 10, wherein the first contact and the third contact are arranged in parallel to form a first interlock signal circuit, and the second contact and the fourth contact are arranged in series to form a second interlock signal circuit.

12. The semiconductor fabrication system of claim 11, wherein:
   the interlock circuit is coupled to the first and second interlock signal circuits and is configured so that:
   the first interlock condition is actuated when the first interlock signal circuit is in an open circuit condition; and
   the second interlock condition is actuated when the second interlock signal circuit is in an open circuit condition.

13. The semiconductor fabrication system of claim 9, wherein the first and second switches are substantially identical.

14. A semiconductor fabrication system, comprising:
   a processing chamber;
   a first switch mounted on the processing chamber;
   a second switch mounted on the processing chamber; and
   a first lid and a second lid, the first and second lids interchangeably installable on the processing chamber, the first lid configured to actuate the first switch but not the second switch when the first lid is situated in a closed position on the processing chamber, the second lid configured to actuate both the first switch and the second switch when the second lid is situated in a closed position on the processing chamber.

15. The semiconductor fabrication system of claim 14, further comprising an interlock circuit coupled to the first switch and the second switch.

16. The semiconductor fabrication system of claim 15, further comprising a gas transmission mechanism coupled to the interlock circuit and adapted to selectively transmit a plurality of gases to the process chamber.

17. The semiconductor fabrication system of claim 14, wherein the processing chamber is a deposition chamber.

18. The semiconductor fabrication system of claim 17, wherein the processing chamber is a chemical vapor deposition chamber.

19. The semiconductor fabrication system of claim 14, wherein the second lid has a pair of tabs, each of the tabs being adapted to actuate a respective one of the first and second switches; and the first lid has only a single tab, adapted to actuate the first switch.

20. The semiconductor fabrication system of claim 14, wherein the first switch and the second switch are substantially identical.

21. In combination, a processing chamber having a first switch and a second switch mounted thereon, a first lid selectively installable on the processing chamber and adapted to actuate only one of the switches when installed on the processing chamber, and a second lid selectively installable on the processing chamber and adapted to actuate both of the switches when installed on the processing chamber.

22. The combination of claim 21, wherein the processing chamber is a chemical vapor deposition chamber.

23. The combination of claim 21, wherein the switches are substantially identical.

24. The combination of claim 21, wherein the first lid has at least one viewport adapted to permit viewing of the interior of the processing chamber.

25. A method of operating a processing chamber, comprising:
   providing a first lid and a second lid;
   interlocking flow of a plurality of gases to the processing chamber when no lid is installed on the processing chamber, the plurality of gases including a first gas and a second gas;
   interlocking flow of the first gas to the processing chamber when the first lid is installed on the processing chamber, while allowing flow of the second gas to the processing chamber; and
   allowing flow of the plurality of gases to the processing chamber when the second lid is installed on the processing chamber.

26. The method of claim 25, wherein the first gas is a toxic gas and the second gas is a non-toxic gas.

27. A method of operating a processing chamber, comprising: providing a first switch and a second switch;
   mounting the first switch and the second switch on the processing chamber;

providing a first lid and a second lid;

installing the first lid on the processing chamber, the first lid actuating the first-switch but not the second switch when installed on the processing chamber; and installing the second lid on the processing chamber in place of the first lid, the second lid actuating the first and second switches when installed on the processing chamber.

28. A method of operating a processing chamber, comprising:

providing a first lid and a second lid;

interlocking flow of a plurality of fluids to the processing chamber when no lid is installed on the processing chamber, the plurality of fluids including a first fluid and a second fluid;

interlocking flow of the first fluid to the processing chamber when the first lid is installed on the processing chamber, while allowing flow of the second fluid to the processing chamber; and allowing flow of the plurality of fluids to the processing chamber when the second lid is installed on the processing chamber.

29. The method of claim 28, wherein the first fluid is a toxic gas and the second fluid is a non-toxic gas.

* * * * *